US012300746B2

(12) United States Patent
Zhou et al.

(10) Patent No.: US 12,300,746 B2
(45) Date of Patent: May 13, 2025

(54) GaN HEMT TRANSISTOR WITH IMPACT ENERGY RELEASE CAPABILITY FOR USE IN AEROSPACE IRRADIATION ENVIRONMENT AND PREPARATION METHOD THEREOF

(71) Applicant: NANJING UNIVERSITY, Nanjing (CN)

(72) Inventors: Feng Zhou, Nanjing (CN); Yu Rong, Nanjing (CN); Hai Lu, Nanjing (CN); Weizong Xu, Nanjing (CN); Dong Zhou, Nanjing (CN); Fangfang Ren, Nanjing (CN)

(73) Assignee: NANJING UNIVERSITY, Nanjing (CN)

( * ) Notice: Subject to any disclaimer, the term of this patent is extended or adjusted under 35 U.S.C. 154(b) by 0 days.

(21) Appl. No.: 18/647,027

(22) Filed: Apr. 26, 2024

(65) Prior Publication Data

US 2025/0126824 A1  Apr. 17, 2025

(30) Foreign Application Priority Data

Oct. 17, 2023 (CN) .......................... 202311343078.9

(51) Int. Cl.
*H01L 29/778* (2006.01)
*H01L 29/20* (2006.01)
(Continued)

(52) U.S. Cl.
CPC ........ *H01L 29/778* (2013.01); *H01L 29/2003* (2013.01); *H01L 29/452* (2013.01);
(Continued)

(58) Field of Classification Search
None
See application file for complete search history.

(56) References Cited

U.S. PATENT DOCUMENTS

2013/0168687 A1* 7/2013 Kuo ................ H01L 29/432
257/76

FOREIGN PATENT DOCUMENTS

CN     104393045 A    3/2015
CN     111834455 A    10/2020
(Continued)

OTHER PUBLICATIONS

Notification to Grant Patent Right for Invention, Chinese Application No. 202311343078.9 mailed Jan. 2, 2024 (3 pages).
(Continued)

*Primary Examiner* — Grant S Withers
(74) *Attorney, Agent, or Firm* — Daniel M. Cohn (57) ABSTRACT

The present invention discloses a GaN HEMT transistor with impact energy release capability for use in aerospace irradiation environment and preparation method thereof. The transistor includes a substrate layer, a gallium nitride layer, a barrier layer, and a gate structure successively arranged from bottom to top. The gallium nitride layers on both sides of the barrier layer are respectively provided with a source electrode and a drain electrode on the top surface. The gate structure is located near the source electrode and includes a p-type gallium nitride layer, a dielectric layer, an Ohmic metal pillar, and a Schottky metal layer. The present invention solves the breakdown problem caused by the inability to release impact energy during the switching process by introducing an asymmetric multi-integrated gate structure.

3 Claims, 3 Drawing Sheets

(51) Int. Cl.
  *H01L 29/45*  (2006.01)
  *H01L 29/47*  (2006.01)
  *H01L 29/66*  (2006.01)

(52) U.S. Cl.
  CPC ........ *H01L 29/475* (2013.01); *H01L 29/7786* (2013.01); *H01L 29/7787* (2013.01); *H01L 29/66462* (2013.01)

(56) References Cited

FOREIGN PATENT DOCUMENTS

| CN | 112930602 A | 6/2021 |
| CN | 113675270 A | 11/2021 |
| CN | 116093143 A | 5/2023 |
| CN | 116344586 A | 6/2023 |

OTHER PUBLICATIONS

CNIPA, Office Action issued for Chinese Application No. 202311343078.9, mailed Nov. 24, 2023 (8 pages).
Wen-Shiuan Tsai et al. Design of Hybrid Schottky-Ohmic Gate in Normally-Off p-GaN Gate AlGaN/GaN HEMTs, "ECS Journal of Solid State Science and Technology", vol. 10, Issue 12, full text, Issue date Dec. 1, 2021.

\* cited by examiner

GaN HEMT TRANSISTOR WITH IMPACT ENERGY RELEASE CAPABILITY FOR USE IN AEROSPACE IRRADIATION ENVIRONMENT AND PREPARATION METHOD THEREOF

CROSS-REFERENCE OF RELATED APPLICATIONS

This patent application claims the benefit and priority of Chinese Patent Application No. 202311343078.9 filed on Oct. 17, 2023, the disclosure of which is incorporated by reference herein in its entirety as part of the present application.

TECHNICAL FIELD

The present invention belongs to the field of semiconductor technology, specifically relating to a GaN HEMT transistor with impact energy release capability for use in aerospace irradiation environment and preparation method thereof.

BACKGROUND

The radiation effects in the space irradiation environment refer to the phenomena that high-energy charged particles cause anomalies, malfunctions or failures of spacecraft components, materials, etc., through ionization, atomic displacement, nuclear reactions or other kinds of action on matter.

Gallium nitride (GaN) materials have gained wide-spread attention and rapid development due to their superior properties such as high frequency, high efficiency, high power, high-pressure resistance, high-temperature resistance, and strong radiation resistance. Enhanced GaN-based high-electron-mobility transistors (HEMT) have characteristics such as high electron mobility, high electron saturation velocity, high breakdown voltage, good high-temperature stability, fast switching speed, and simple process steps, and are commonly used in high-power switching devices. When operating in high voltage, high current and aerospace irradiation environments, GaN HEMT devices are often, due to the presence of parasitic capacitance and parasitic inductance, affected by the impact energy in the circuit during the switching process of electronic systems in both civilian and aerospace radiation environments. When the transistor switches from the 'on' mode to the 'off' mode, a certain amount of energy is still stored in the capacitance and inductance between the gate and drain. And, in civilian and aerospace radiation environments, this stored energy can still be released into the transistor, easily generating a strong electric field inside the transistor. Typical Si-based and SiC-based MOSFETs, when faced with transient impact energy, can release this energy by carrier collision ionization and avalanche multiplication. However, due to the unique material and structural characteristics of the device, GaN HEMTs prepared based on AlGaN/GaN heterojunctions are unable to form a body diode inside the transistor, and cannot maintain and release transient energy impact using the avalanche breakdown characteristics of the body diode. GaN HEMTs used in civilian and aerospace radiation environments are power transistors without avalanche capability. Therefore, when the peak electric field strength is higher than the critical breakdown field strength, the electrical performance of the transistor degrades, and catastrophic device failure or widespread thermal burnout may occur, leading to serious reliability issues and even endangering the entire electronic system in civilian and aerospace radiation environments.

Figure 1:
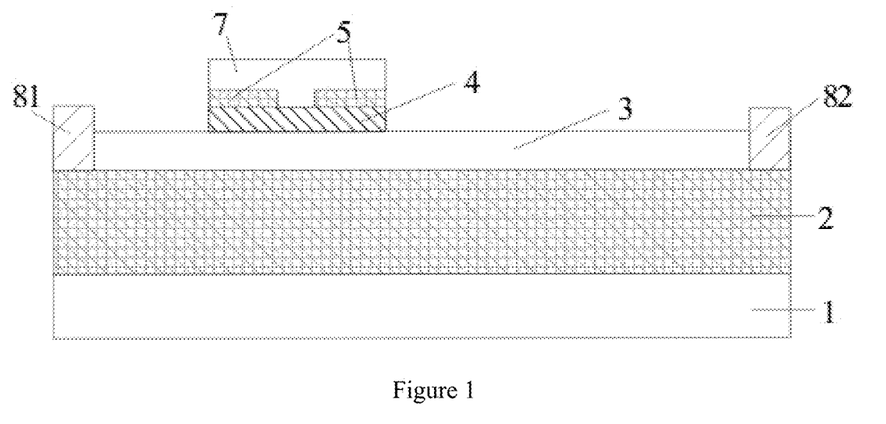
FIG. 1 shows the schematic diagram of the structure of the enhanced gallium nitride-based high-electron-mobility transistor in the prior art.

As shown in FIG. 1, the enhanced gallium nitride-based high-electron-mobility transistor (HEMT), representative of the existing technology, often uses Schottky gate contacts, which significantly reduce gate leakage current. However, the Schottky barrier, due to its rectifying effect, limits the flow of electrons from the gate to the metal above the gate, preventing the energy between the gate-drain capacitance from being released from the gate to the outside of the transistor during the switching process. As GaN HEMTs lack avalanche capability, strong electric fields can easily occur locally inside the transistor, leading to device failure. Currently, there lacks a solution for the gate breakdown issue caused by the inability of commercial devices used in civilian and aerospace radiation environments to release impact energy during the switching process.

SUMMARY OF THE INVENTION

The present invention addresses the shortcomings of the existing technology by providing an asymmetric multi-integrated gate structure GaN HEMT transistor with impact energy release capability for use in aerospace irradiation environment and preparation method thereof. The invention achieves the effect of releasing impact energy, which enter into the transistor through the drain end, from the asymmetric Ohmic metal pillar (Structure 1) by introducing an asymmetric multi-integrated gate structure. The main pillar in Structure 1 and the second auxiliary pillar on the right side release most of the energy due to their deeper burial depth and closer proximity to the GaN channel, while the first auxiliary pillar on the left side releases the remaining energy. However, the first auxiliary pillar on the left side plays an important role in maintaining the polarization effect of the AlGaN/GaN layer and minimizing the impact on the forward current capability between the gate and source.

Additionally, the Schottky metal/dielectric/semiconductor layer (Structure 2, MIS) and the Schottky metal/p-type gallium nitride layer/semiconductor (Structure 3) in the gate region effectively reduce gate leakage, enhancing the robustness of the gate. The production method of the present invention is simple and compatible with existing process steps, allowing concurrently for both the release of impact energy and high gate robustness.

To achieve the above objectives, the technical solution adopted in the present invention is as follows:

A GaN HEMT transistor with impact energy release capability comprises, arranged from bottom to top, a substrate layer, a gallium nitride layer, a barrier layer and a gate structure; the top surface of the gallium nitride layer on the two outer sides of the barrier layer is respectively provided with a source and a drain; the gate structure is set near the source side and includes a p-type gallium nitride layer, a dielectric layer, an Ohmic metal pillar, and a Schottky metal layer; the Ohmic metal pillar includes a main pillar partially buried inside the barrier layer, as well as first and second auxiliary pillars set on the left and right sides of the main pillar respectively; the buried end surface of the main pillar contacts the top surface of the gallium nitride layer, while the other end surface contacts the bottom surface of the Schottky metal layer; the first auxiliary pillar has a shallower maximum burial depth inside the barrier layer compared to the second auxiliary pillar, forming an asymmetric gate structure.

Preferably, the burial depth of the second auxiliary pillar decreases successively towards the drain direction, and the burial depths of all first auxiliary pillars are consistent with the burial depth of the shallowest second auxiliary pillar on the right side.

Preferably, the calculation model for the quantity n of the second auxiliary pillars is as follows:

$$\frac{t}{d} - 1 \le n < \frac{t}{d},$$

n takes positive integers; where t is the thickness of the barrier layer, d is the decreasing depth of the second auxiliary pillars, and takes any integer between $$\left(0, \frac{t}{2}\right);$$

the quantity of the first auxiliary pillars is not greater than the quantity of the second auxiliary pillars.

Preferably, the p-type gallium nitride layer comprises the first p-type gallium nitride layers and second p-type gallium nitride layers arranged at intervals; the dielectric layers are arranged at intervals along the width direction of the gate structure on the top surfaces of the first p-type gallium nitride layers, the barrier layers, and the second p-type gallium nitride layers; the dielectric layers and the Ohmic metal pillars are arranged alternately, and the Schottky metal layers are overlaid on the top surfaces of and in contact with the first p-type gallium nitride layers, the second p-type gallium nitride layers, the dielectric layers and the Ohmic metal pillars, forming multiple integrated gate structures: Schottky metal/dielectric layer/semiconductor and Schottky metal/p-type gallium nitride layer/semiconductor.

Preferably, the lengths of the first and second p-type gallium nitride layers are 0.3 to 0.8 µm, with a spacing of 0 to 5 µm; the sum of the widths of the first and second p-type gallium nitride layers accounts for more than 20% of the overall width of the gate structure.

Preferably, the widths of the main pillar, first auxiliary pillar, and second auxiliary pillar are 20 to 100 nm, with a spacing of 50 to 100 nm.

Preferably, a third p-type gallium nitride layer with a width of 0.05 to 0.1 µm is provided between the main pillar and the first auxiliary pillar:

A method for fabricating a GaN HEMT transistor with impact energy release capability comprises the following steps:

step 1: On the epitaxial wafer it grows, sequentially from bottom to top, the substrate layer, gallium nitride layer, barrier layer and p-type gallium nitride layer; then part of the p-type gallium nitride layer is removed by etching; and then a dielectric layer slightly thicker than the p-type gallium nitride layer is grown;

step 2: Multiple-step masking technique is used to create buried windows for the source, drain, and Ohmic metal pillars at different depths;

step 3: Ohmic metal is deposited within the buried windows formed in step 2 to create the source, drain and Ohmic metal pillars, followed by the growth of another dielectric layer;

step 4: The dielectric layer above the p-type gallium nitride layer on the left and right sides of the gate region, as well as above the Ohmic metal pillars is etched away; and, a Schottky metal layer is subsequently deposited;

step 5: A passivation layer is applied to the entire epitaxial wafer; then, the area above the source, drain and gate is etched and an interconnecting metal layer is afterwards deposited on it; The metal layer in the soldering pad area of the source, drain and gate of the transistor is thickened, thus the transistor's fabrication is completed.

Preferably, the multiple-step masking technique in step 2 involves: first, coating the entire epitaxial wafer with photoresist; the first mask exposes all Ohmic metal pillars, as well as the source and drain areas; using the inductively-coupled plasma etching method, the depth of the buried Ohmic metal pillars is strictly controlled to create the shallowest Ohmic metal pillars, namely, the buried windows for the first auxiliary pillar on the left side and the second auxiliary pillar on the right side which is closest to the drain; the previously-mentioned shallowest Ohmic metal pillar region needs to be removed from the exposed area of the second mask, and so on, until the buried windows for the main pillar at the bottom of the barrier layer are formed.

Preferably, in step 1, the repair method for etching damage involves immersing the epitaxial wafer in a solution of tetramethyl amine hydroxide solution or treating it with a combination of oxygen plasma and dilute hydrochloric acid; the dielectric layer can be made of any or any combination of silicon dioxide, silicon nitride, and aluminum oxide;

in step 2, the relationship between the number of masks for the gate buried region, m for short, and the number of the second auxiliary pillar n is m=n+1; the ICP etching conditions include: using Cl2, Ar, and BCl3 as etching gases, maintaining the pressure of the reaction chamber between 0.6 and 1.2 Pa, applying an etching power of 200-300 W, and a DC bias of −60 to −100 V; after being etched, the epitaxial wafer is treated with low-temperature annealing at 380° C. for 200 seconds in a nitrogen atmosphere to effectively reduce the number of dangling bonds and to repair nitrogen vacancies;

in step 3, the annealing conditions for the Ohmic metal layer are: in a nitrogen atmosphere, at 800-900° C. and annealed for 3 minutes; the materials of the dielectric layer deposited for the second time are also any or any combination of silicon dioxide, silicon nitride, and aluminum oxide;

in step 4, the method of inductively coupled plasma etching is used to remove the dielectric layer, creating a window for depositing the Schottky metal layer; the annealing conditions for the Schottky metal layer are nitrogen atmosphere at 300-400° C. for 60-200 seconds;

in step 5, the passivation layer consists of any or any combination of silicon dioxide, silicon nitride and polyimide, coming with a thickness of 1000-4000 nm; the interconnecting metal layer contains titanium and aluminum, coming with a thickness of 1000-5000 nm.

The Beneficial Effects of the Invention

Compared to existing techniques, the beneficial effects that the present invention can achieve include:

(1) The invention achieves the effect of releasing impact energy, which enters into the transistor through the drain end, from the asymmetric Ohmic metal pillar (Structure 1) by introducing an asymmetric multi-integrated gate structure. The main pillar in Structure 1 and the second auxiliary pillar release most of the energy due to their closer proximity to the GaN channel, while the first auxiliary pillar on the left side of the main pillar (Structure 1) releases the remaining energy owing to the fact that it is farther away from the GaN channel. However, this design effectively maintains the polarization function of the AlGaN/GaN layer, therefore the forward current capability between the gate and the source is not compromised.

(2) The multi-integrated gate structure in the gate region includes Schottky metal/dielectric layer/semiconductor (Structure 2, MIS), and Schottky metal/p-type gallium nitride layer/semiconductor (Structure 3); this design effectively reduces gate leakage and enhances gate robustness.

(3) This invention features simultaneous etching of both the gate Ohmic metal pillar windows and the source-drain Ohmic contact points, enables the Ohmic metal pillar and the Ohmic metal layer of both the source and drain to be deposited concurrently. Because of its compatibility with existing manufacturing processes, this invention is simple to realize and carries high commercial potential. The simple fabrication method for this GaN HEMT transistor with asymmetric multi-integrated gate structure is compatible with the existing technological production process for enhanced gallium nitride-based high-electron-mobility transistors, which provides a solution to improve the reliability and robustness of the gate of the enhanced gallium nitride high-electron-mobility transistors.

(4) The asymmetric multi-integrated gate structure GaN HEMT transistor of the present invention can be applied in aerospace irradiation environments; in which, it exhibits excellent radiation resistance.

BRIEF DESCRIPTION OF THE DRAWINGS

To describe the transistor structure more conveniently, FIG. 2 to FIG. 4D only show the dielectric layer in the area where the gate structure is located and omit the dielectric layer in other areas.

Figure labels: 1. Substrate layer; 2. GaN layer; 3. Barrier layer; 4. p-type gallium nitride layer; 5. Dielectric layer; 6. Ohmic metal pillar; 7. Schottky metal layer; 41. First p-type gallium nitride layer; 42. Second p-type gallium nitride layer; 43. Third p-type gallium nitride layer; 61. Main pillar; 62. First auxiliary pillar; 63. Second auxiliary pillar; 81. Source electrode; 82. Drain electrode.

DETAILED DESCRIPTION OF THE EMBODIMENTS

In order to make the technical solutions of the present invention to be better understood, a description of the preferable scheme of embodiment of the present invention will be provided in conjunction with a practical example. However, it should be understood that the attached drawings are for illustrative purposes only and should not be construed as limiting the scope of the patent. For better illustration of the example of embodiment, certain components in the drawings may be omitted, enlarged or reduced, and they do not indicate the actual dimensions of the product. For those skilled in the art, it may be understood that certain known structures and their descriptions in the attached drawings may be omitted. The positional relationships described in the drawings are for illustrative purposes only and should not be construed as limiting the scope of the patent.

Figure 2:
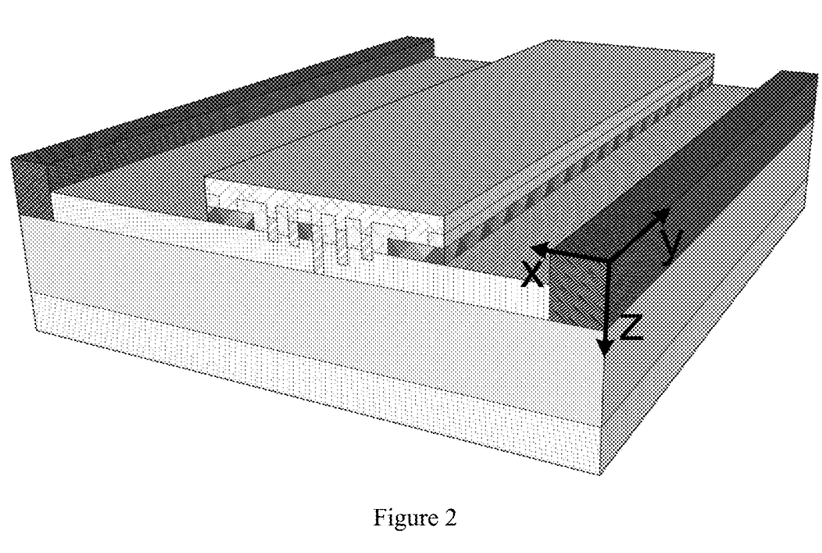
FIG. 2 shows the structural stereogram of the asymmetric multi-integrated gate structure GaN HEMT transistor of the present invention with the ability to release impact energy; wherein, for the second auxiliary pillars, the X direction is the width direction, Y direction is the length direction, and Z direction is the depth direction.
Figure 3:
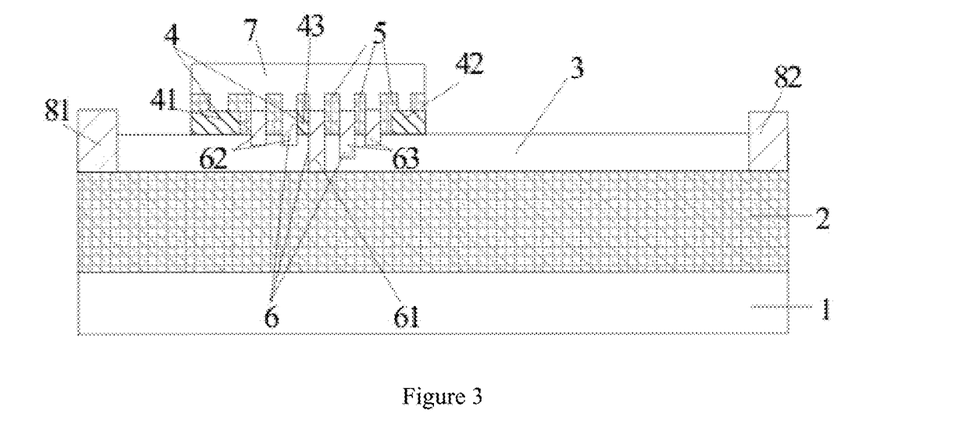
FIG. 3 shows the schematic diagram of the asymmetric multi-integrated gate structure GaN HEMT transistor of the present invention with the ability to release impact energy (i.e. the X-direction cross-section of FIG. 2).

As shown in FIGS. 2 and 3, a GaN HEMT transistor with the ability to release impact energy in aerospace irradiation environments comprises, successively arranged from bottom to top, a substrate layer 1, a GaN layer 2, a barrier layer 3, and a gate structure. The top surfaces of the GaN layer 2 on the outer sides of the barrier layer 3 are respectively provided with a source electrode 81 and a drain electrode 82. The characteristic of the transistor consists in that: the gate structure is set near the side of the source electrode 81; the gate structure includes a p-type gallium nitride layer 4, a dielectric layer 5, an Ohmic metal pillar 6, and a Schottky metal layer 7; the Ohmic metal pillar 6 includes a main pillar 61 which is partially embedded in the barrier layer 3, and a first auxiliary pillar 62 and a second auxiliary pillar 62 which are set respectively on the left and right sides of the main pillar 61; the surface of the buried end of the main pillar 61 contacts the top surface of the GaN layer 2, while the surface of the other end contacts the bottom surface of the Schottky metal layer 7; the maximum depth of the first auxiliary pillar 62 being embedded in the barrier layer 3 is shallower than that of the second auxiliary pillar 63, forming an asymmetric gate structure.

The embedding depth of the second auxiliary pillar 63 decreases in the direction towards the drain electrode 82, and the embedding depths of all first auxiliary pillars 62 are consistent with the shallowest embedding depth of the second auxiliary pillar 63 on the right side.

The calculation model for the quantity n of the second auxiliary pillars 63 is as follows:

$$\frac{t}{d} - 1 \le n < \frac{t}{d},$$

n takes positive integers; where t is the thickness of the barrier layer 3, d is the decreasing depth of the second auxiliary pillars 63, and takes any integer between $$\left(0, \frac{t}{2}\right);$$

the quantity of the first auxiliary pillars 62 is not greater than the quantity of the second auxiliary pillars 63. Specifically, taking the embedding depth of the main pillar 61 as the first term, the embedding depth of Number n of the auxiliary pillars 63 on the right side is $a_n = a_0 - nd$; and given that $a_0 = t$, the embedding depth of Number n of the auxiliary pillars 63 on the right side is $a_n = t - nd$; this process continues until the embedding depth is no greater than the decreasing depth d, namely $a_n \le d$, at which point the number of pillars is no longer increased. The smaller the difference between embedding depths of the second auxiliary pillars 63, the greater the number of pillars; since $0<a_n\leq d$, namely $0<t-nd\leq d$, the relationship between the number of second auxiliary pillars 63 and the decreasing depth d is $$\frac{t}{d}-1 \leq n < \frac{t}{d}$$

where n is a positive integer.

From the above structural design, it can be seen that the invention achieves the effect of releasing impact energy, which enter into the transistor through the drain end, from the asymmetric Ohmic metal pillar (Structure 1) by introducing an asymmetric multi-integrated gate structure. The main pillar in Structure 1 and the second auxiliary pillar release most of the energy due to their closer proximity to the GaN channel, while the first auxiliary pillar on the left side of the main pillar (Structure 1) releases the remaining energy owing to the fact that it is farther away from the GaN channel. However, this design effectively maintains the polarization function of the AlGaN/GaN layer, therefore the forward current capability between the gate and the source is not compromised.

As shown in FIG. 2, the p-type gallium nitride layer 4 comprises the first p-type gallium nitride layers 41 and second p-type gallium nitride layers 42 which are arranged at intervals. The dielectric layers 5 are arranged at intervals along the width direction of the gate structure on the top surfaces of the first p-type gallium nitride layers 41, the barrier layers 3 and the second p-type gallium nitride layers 42. The dielectric layers 5 and the Ohmic metal pillars 6 are arranged alternately; the Schottky metal layers 7 are overlaid on the top surfaces of and in contact with the first p-type gallium nitride layers 41, the second p-type gallium nitride layers 42, the dielectric layers 5 and the Ohmic metal pillars 6, forming multiple integrated gate structures: Schottky metal 7/dielectric layer 5/semiconductor (structure 2) and Schottky metal 7/p-type gallium nitride layer 4/semiconductor (structure 3).

In some cases of this invention's embodiment, the numbers of first auxiliary pillars 62 and second auxiliary pillars 63 are all set as 2, as a result three structures follow: Ohmic metal pillar 6 (Structure 1), Schottky metal 7/dielectric layer 5/semiconductor (Structure 2), and Schottky metal 7/p-type gallium nitride layer 4/semiconductor (Structure 3). The order from left to right is: 2/3/2/2/1/2/1/2/1/2/1/2/1/2/2/3/2.

It can be seen from the above structural design that the multiple integrated gate structures in the gate region are: Schottky metal 7/dielectric layer 5/semiconductor (Structure 2, MIS), and Schottky metal 7/p-type gallium nitride layer 4/semiconductor (Structure 3). This design effectively reduces gate leakage and enhances gate robustness. Here, the word 'semiconductor' refers to any of the first p-type gallium nitride layer 41, the second p-type gallium nitride layer 42, the third p-type gallium nitride layer 43 or the barrier layer 3.

The lengths of the first p-type gallium nitride layer 41 and the second p-type gallium nitride layer 42 are between 0.3 and 0.8 μm, their spacing is between 0 and 5 μm. The sum of the widths of the first p-type gallium nitride layer 41 and the second p-type gallium nitride layer 42 accounts for more than 20% of the overall width of the gate structure. This design maintains the ability of the first p-type gallium nitride layer 41 and the second p-type gallium nitride layer 42 to deplete the two-dimensional electron gas, and therefore achieves enhanced operation.

The third p-type gallium nitride layer 43 with a width of 0.05~0.1 μm is arranged between the main pillar 61 and the first auxiliary pillar 62, serving to isolate the asymmetric gate structure. When the device is in the 'off' state, the intermediate third p-type gallium nitride layer 43 depletes the two-dimensional electron gas in the channel; and, the impact energy entering from the drain end is isolated by the third p-type gallium nitride layer 43, with most of the energy being released from the main pillar 61 and the second auxiliary pillar 62.

The widths of the main pillar 61, the first auxiliary pillar 62 and the second auxiliary pillar 63 are between 20 and 100 nm, with a spacing between 50 and 100 nm.

Based on the above structural design, the present invention provides a method for producing a GaN HEMT transistor with impact energy release capability, which includes the following steps:

Step 1: Preparation of the Epitaxial Wafer

Figure 4A:
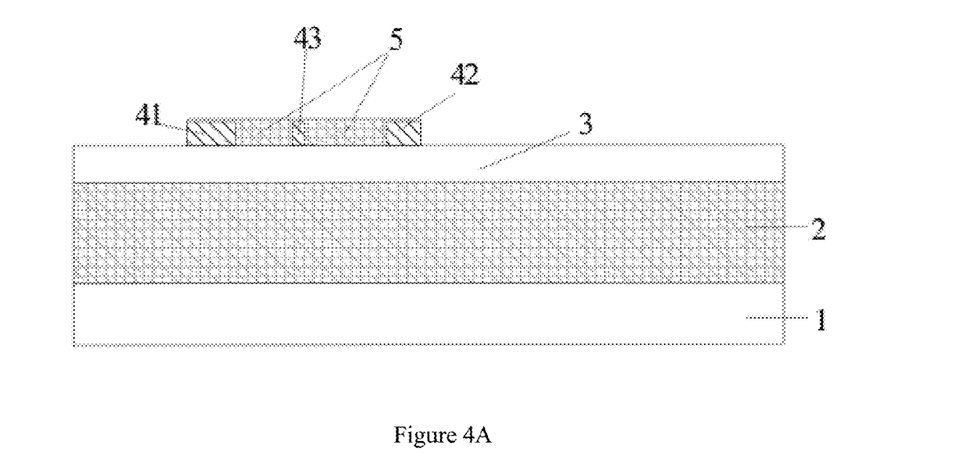
FIGS. 4A, 4B, 4C, and 4D show the process schematic diagrams for producing the asymmetric multi-integrated gate structure GaN HEMT transistor with the ability to release impact energy.

As shown in FIG. 4A, the epitaxial wafer structure includes, from bottom to top, the substrate layer 1, gallium nitride layer 2, barrier layer 3 and p-type gallium nitride layer 4 in succession; the substrate layer 1 is made of silicon and 630 μm thick; the gallium nitride layer 2 is 3.3 μm thick; the barrier layer 3 is made of AlGaN with a thickness of 20 nm; the p-type gallium nitride layer 4 is magnesium-doped with a thickness of 110 nm. Please note: the drawing is illustrative only, not drawn to scale.

Step 2: Etching of p-Type Gallium Nitride Layer 4 and Deposition of the First Dielectric Layer The structures corresponding to the first p-type gallium nitride layer 41, the second p-type gallium nitride layer 42, and the third p-type gallium nitride layer 42 in the p-type gallium nitride layer 4 are retained, and other structures are etched away; The etched epitaxial wafer is treated with tetramethylamine hydroxide (TMAH) solution or oxygen plasma and dilute hydrochloric acid solution to reduce etching damage; then, a first layer of dielectric layer slightly thicker than the p-type gallium nitride layer is deposited over the entire epitaxial wafer, the material of the first dielectric layer is silicon dioxide.

Step 3: Multi-Step Mask Technology is Employed to Form the Buried Window of the Main Pillar 61, the First Auxiliary Pillars 62, and the Second Auxiliary Pillars 63 with Different Depths, and the Deposition Areas of the Source Electrode 81 and the Drain Electrode 82.

Three masks are prepared in advance. The relationship between the number m of masks and the number n of the second auxiliary pillars 63 is m=n+1. Taking the decreasing depth of the second auxiliary pillars 63 as 8 nm as an example, the relationship between the number of the second auxiliary pillars 63 and the decreasing depth is $$\frac{t}{d}-1 \leq n < \frac{t}{d}$$

(n takes a positive integer); The number of second auxiliary pillars 63 is 2, so the number of masks in the gate buried area is 3.

Figure 4B:
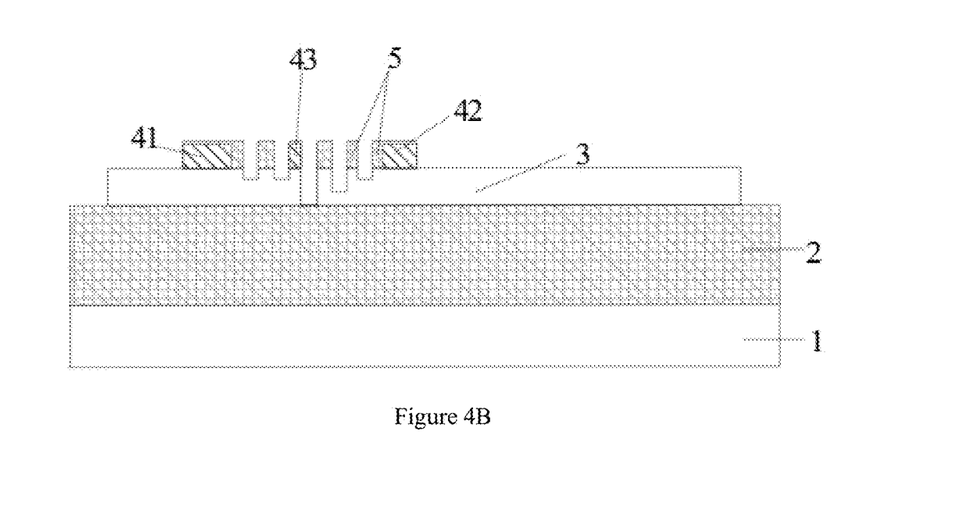

As shown in FIG. 4B, Coating the entire epitaxial wafer with photoresist; Employing the inductively coupled plasma etching method, firstly use the first mask to etch the first dielectric layer and the barrier layer on the epitaxial wafer to form a buried window (with a depth of 4 nm) of the shallowest first auxiliary pillars 62 and the second auxiliary pillars 63 closest to the drain on the epitaxial wafer; and then use a second mask to further etch the barrier layer on the epitaxial wafer to form a deeper buried window (depth of 12 nm) for the second auxiliary pillars 63; then use a third mask to etch the barrier layer on the epitaxial wafer in the areas corresponding to the main pillar 61, the source electrode 81 and the drain electrode 82, forming the deepest buried window of the main pillar 61 (with a depth of 20 nm) and the sedimentary area of the source electrode 81 and the drain electrode 82.

The etching condition of the inductively coupled plasma etching method are: using Cl2, Ar, and BCl3 as etching gases, maintaining the pressure of the reaction chamber to 0.8 Pa, applying an etching power of 200 W, and a DC bias of −80 V. After being etched, the epitaxial wafer is treated with low-temperature annealing at 380° C. for 200 seconds in a nitrogen atmosphere to effectively reduce the number of dangling bonds and to repair nitrogen vacancies.

Figure 4C:
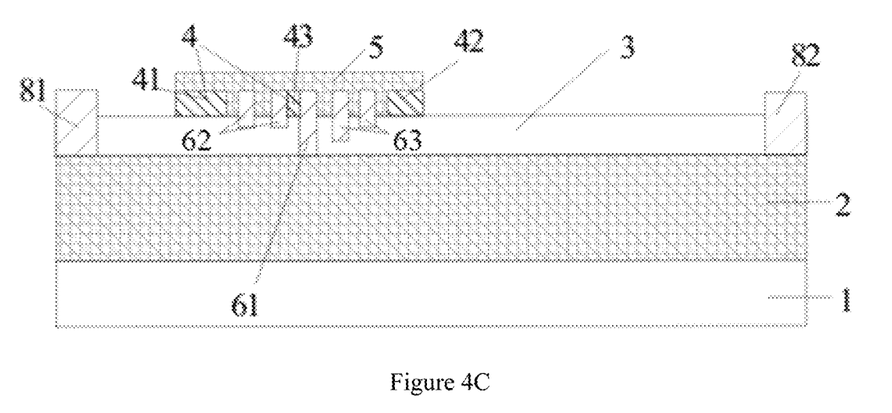

Step 4: The Deposition of Ohmic Metal Layer and the Growth of Second Dielectric Layer:

As shown in FIG. 4C, in the buried windows of the main pillar 61, the first auxiliary pillars 62 and the second auxiliary pillars 63 and the deposition areas of the source electrode 81 and the drain electrode 82 simultaneously deposit an ohmic metal layer; wherein the ohmic metal layer is deposited by electron beam evaporation technique in the order of thickness of 0.02 μm Ti, 0.05 μm Al, 0.04 μm Ni and 0.04 μm Au; and then make it annealed by high-temperature at 850° C. in a nitrogen atmosphere for 3 minutes to form Ohmic contacts; then grow the second dielectric layer 5 over the entire structure; the second dielectric layer grown again can employ another material (a material that also has an electrical isolation effect), or can employ the same material as the dielectric layer in step 2.

Figure 4D:
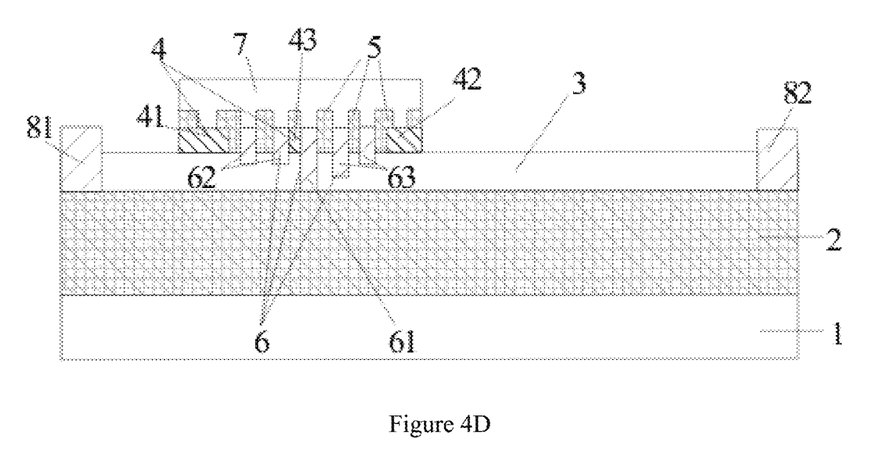

Step 5: Etching and Deposition of Schottky Metal Layers:

As shown in FIG. 4D, the dielectric layer 5 is etched above the first p-type gallium nitride layer 41 and the second p-type gallium nitride layer 42 and above the main pillar 61, the first auxiliary pillars 62 and the second auxiliary pillars 63, and then a Schottky metal layer 7 is deposited on the first p-type gallium nitride layer 41, the second p-type gallium nitride layer 42, the main pillar 61, the first auxiliary pillars 62 and the second auxiliary pillars 63; wherein the Schottky metal layer 7 is deposited by electron beam evaporation technology in the order of TiN and Al with thicknesses of 0.02 μm and 0.3 μm respectively; and then make it annealed by low-temperature at 350° C. in a nitrogen atmosphere for 180 seconds to form gate Schottky contacts; all, including the gate Schottky metal 7/dielectric layer 5/semiconductor (structure 2, MIS), the Schottky metal 7/p-type gallium nitride layer 4/semiconductor (structure 3), structures 2 and 3 together with the main pillar 61, the first auxiliary pillars 62, and the second auxiliary pillars 63 (structure 1) mentioned in steps 4, come together to form a multi-integrated gate structure;

Step 6: Growth of Passivation Layer and Deposition of Interconnecting Metal Layer:

Utilizing the technique of plasma-enhanced chemical vapor deposition, cover the entire epitaxial wafer with a passivation layer; then the passivation layer and dielectric layer are correspondingly etched above the source and drain electrodes, and the passivation layer is correspondingly etched above the gate structure to form three etching windows; and then sequentially deposits Ti and Al with thicknesses of 500 nm and 4000 nm to form an interconnecting metal layer in the etching windows; then, deposits Al or Au to continue to thicken the interconnecting metal layer to complete the transistor's preparation.

The invention achieves the effect of releasing impact energy, which enters into the transistor through the drain end, from the asymmetric Ohmic metal pillar (Structure 1) by introducing an asymmetric multi-integrated gate structure. The main pillar in Structure 1 and the second auxiliary pillar release most of the energy due to their closer proximity to the GaN channel, while the first auxiliary pillar on the left side of the main pillar (Structure 1) releases the remaining energy owing to the fact that it is farther away from the GaN channel. However, this design effectively maintains the polarization function of the AlGaN/GaN layer, therefore the forward current capability between the gate and the source is not compromised. Structures 2 and 3 effectively reduce gate leakage and enhance gate robustness. Therefore, the present invention can simultaneously achieve the release of impact energy and high gate robustness.

In another example of embodiment, the asymmetric multi-integrated gate structure GaN HEMT transistor proposed in the present invention, based on a rationale similar to that which its impact energy release capability is founded on, can also resist the radiation effects in the space irradiation environment and can therefore be applied in space irradiation environment.

In the space radiation field, a large amount of energy is generated inside the transistor due to the effects of single particle radiation. This energy can also be released through the introduction of this asymmetric multi-integrated gate structure. It operates on a principle essentially similar to the release of external impact energy, and is able to resist the radiation effects in the space radiation environment, making it capable of being used in space radiation environment.

Based on the description and drawings of the present invention, those skilled in the art can easily manufacture or use the GaN HEMT transistor or its manufacturing method, which are contents of the present invention, and can achieve the positive effects described in the present invention.

Unless otherwise specified, in this utility model, terms indicating directional or positional relationships, such as "length", "width", "top", "bottom", "front", "back", "left", "right", "vertical", "horizontal", "top", "bottom", "inside", "outside", "clockwise", "counterclockwise", "axial", "radial", "circumferential" and others, are based on the orientation or positional relationships shown in the drawings. They are only for the convenience of describing the utility model and simplifying the description, and does not indicate or imply that the device referred to or any component of it must have a specific position, or must be constructed and operated in a specific position. Therefore, the terms used in this utility model to describe the orientation or positional relationships are for illustrative purposes only and cannot be understood as limiting the scope of the patent. For those skilled in the art, the specific meanings of the above terms can be understood in conjunction with the drawings and according to specific circumstances.

Unless otherwise expressly specified and limited, in the present invention, terms such as "arrangement", "connection" and "linkage" should be broadly interpreted, for example, they can be fixed connections, detachable connections, or integral connections; they can be directly connected, or indirectly connected through an intermediate medium, and can be interconnected within two components. For those skilled in the art, the specific meanings of the above terms in the present invention can be understood according to specific circumstances.

The above are only the preferred embodiment of the present invention. It should be pointed out that the above preferred embodiment examples should not be considered as limiting the present invention, and the scope of protection of the present invention should be determined by the scope defined in the claims. For those skilled in the art, certain modifications and improvements can also be made within the spirit and scope of the present invention, and these modifications and improvements should also be considered within the scope of protection of the present invention.

What is claimed is:

1. A GaN HEMT transistor with impact energy release capability, comprising a substrate layer, a gallium nitride layer, a barrier layer, and a gate structure, arranged from bottom to top; two opposite outer sides of the barrier layer are provided with a source and a drain respectively, the source, the drain, and the barrier layer are arranged together on a top surface of the gallium nitride layer;

wherein the gate structure is set near the source and comprises a p-type gallium nitride layer, dielectric layers, Ohmic metal pillars, and a Schottky metal layer; the Ohmic metal pillars comprise a main pillar partially buried inside the barrier layer, first auxiliary pillars provided on a left side of the main pillar, and second auxiliary pillars provided on a right side of the main pillar; a buried end of the main pillar contacts the top surface of the gallium nitride layer, while the other end contacts a bottom surface of the Schottky metal layer; the first auxiliary pillars have a shallower maximum burial depth inside the barrier layer compared to the second auxiliary pillars, to form an asymmetric gate structure;

the p-type gallium nitride layer comprises first p-type gallium nitride layers and second p-type gallium nitride layers arranged at intervals; the dielectric layers are arranged at intervals along the width direction of the gate structure on top surfaces of the first p-type gallium nitride layers, the barrier layer, and the second p-type gallium nitride layers; the dielectric layers and the Ohmic metal pillars are arranged at intervals; the top surfaces of the first p-type gallium nitride layers, the second p-type gallium nitride layers, the dielectric layers and the Ohmic metal pillars are all covered by the Schottky metal layer and in contact with the Schottky metal layer, forming multiple integrated gate structures.

2. The GaN HEMT transistor of claim 1, wherein burial depths of the second auxiliary pillars decrease successively in the width direction closer to the drain, one of the second auxiliary pillars closest to the drain is a shallowest second auxiliary pillar, and burial depths of the first auxiliary pillars are consistent with a burial depth of the shallowest second auxiliary pillar.

3. The GaN HEMT transistor of claim 2, wherein a number of the second auxiliary pillars is calculated using a formula as follows:

$$\frac{t}{d} - 1 \le n < \frac{t}{d},$$

n is a positive integer;

wherein, t is a thickness of the barrier layer; d is a decreasing depth of the second auxiliary pillars, and takes any integer between $$\left(0, \frac{t}{2}\right);$$

a number of the first auxiliary pillars is not greater than the number of the second auxiliary pillars.

* * * * *